United States Patent
Usui et al.

(10) Patent No.: US 9,487,696 B2
(45) Date of Patent: Nov. 8, 2016

(54) PHOSPHOR OF SIALON CRYSTAL, METHOD FOR PRODUCING PHOSPHOR AND LIGHT EMITTING DEVICE

(71) Applicants: Kabushiki Kaisha Toshiba, Tokyo (JP); Toshiba Materials Co., Ltd., Yokohama-Shi (JP)

(72) Inventors: Daichi Usui, Yokohama (JP); Yasuhiro Shirakawa, Yokohama (JP); Hirofumi Takemura, Kamakura (JP); Tsutomu Ishii, Yokohama (JP)

(73) Assignees: Kabushiki Kaisha Toshiba, Minato-Ku (JP); Toshiba Materials Co., Ltd., Yokohami-Shi (JP)

( * ) Notice: Subject to any disclaimer, the term of this patent is extended or adjusted under 35 U.S.C. 154(b) by 0 days.

(21) Appl. No.: 14/383,675

(22) PCT Filed: Mar. 15, 2013

(86) PCT No.: PCT/JP2013/057407
§ 371 (c)(1),
(2) Date: Sep. 8, 2014

(87) PCT Pub. No.: WO2013/137436
PCT Pub. Date: Sep. 19, 2013

(65) Prior Publication Data
US 2015/0030855 A1 Jan. 29, 2015

(30) Foreign Application Priority Data
Mar. 16, 2012 (JP) .................. 2012-060087

(51) Int. Cl.
*C09K 11/77* (2006.01)
*C09K 11/78* (2006.01)
(Continued)

(52) U.S. Cl.
CPC ........ *C09K 11/7721* (2013.01); *C09K 11/0883* (2013.01); *F21V 9/16* (2013.01)
(Continued)

(58) Field of Classification Search
CPC ........... C01P 2004/32; C01P 2004/51; C01P 2004/61
USPC ................ 252/301.4 R, 521.1, 521.3, 521.6; 423/21.1, 111, 155, 161, 331; 428/402, 428/403
See application file for complete search history.

(56) References Cited

U.S. PATENT DOCUMENTS 7,887,718 B2 * 2/2011 Nagatomi .......... C09K 11/7721
252/301.36
2005/0230689 A1 * 10/2005 Setlur ................ C09K 11/7718
257/79
(Continued)

FOREIGN PATENT DOCUMENTS

CN 101443432 A 5/2009
EP 1 867 697 A1 12/2007
(Continued)

OTHER PUBLICATIONS

International Preliminary Report on Patentability (Application No. PCT/JP2013/057407) dated Sep. 16, 2014.
(Continued)

*Primary Examiner* — Holly Le
(74) *Attorney, Agent, or Firm* — Burr & Brown, PLLC

(57) ABSTRACT

The present invention provides a phosphor comprising a cerium-activated sialon crystal having a basic composition represented by formula (1):

$$(Sr_{1-x}Ce_x)_\alpha Si_\beta Al_\gamma O_\delta N_\omega \quad \text{formula: (1)}$$

(wherein, x is 0<x<1, α is 0<α≤3, and β, γ, δ and ω are numbers such that numerical values converted when α is 2 satisfy 5≤β≤9, 1≤γ≤5, 0≤δ≤1.5, and 10≤ω≤20), wherein the phosphor includes particles having a sphericity of 0.65 or more and emits yellow light by being excited by ultraviolet light, violet light or blue light.

8 Claims, 1 Drawing Sheet

(51) Int. Cl.
    *C09K 11/79*     (2006.01)
    *C09K 11/80*     (2006.01)
    *C09K 11/86*     (2006.01)
    *H01L 33/50*     (2010.01)
    *C09K 11/08*     (2006.01)
    *F21V 9/16*     (2006.01)
    *H01S 5/00*     (2006.01)
    *H01S 5/323*     (2006.01)

(52) U.S. Cl.
    CPC ........ *H01L 33/502* (2013.01); *C01P 2004/32* (2013.01); *C01P 2004/51* (2013.01); *C01P 2004/61* (2013.01); *H01S 5/005* (2013.01); *H01S 5/32341* (2013.01); *Y10T 428/2982* (2015.01)

(56) References Cited

U.S. PATENT DOCUMENTS

| | | |
|---|---|---|
| 2006/0197439 A1 | 9/2006 | Sakane et al. |
| 2006/0244356 A1 | 11/2006 | Nagatomi et al. |
| 2007/0075629 A1 | 4/2007 | Le Toquin et al. |
| 2007/0228949 A1 | 10/2007 | Maruyama et al. |
| 2009/0096361 A1 | 4/2009 | Fukuda et al. |
| 2009/0236963 A1* | 9/2009 | Nagatomi et al. ............ 313/483 |
| 2010/0102707 A1 | 4/2010 | Fukuda et al. |
| 2010/0237767 A1 | 9/2010 | Emoto et al. |
| 2011/0309399 A1 | 12/2011 | Shinohara et al. |
| 2015/0014726 A1* | 1/2015 | Usui .................. C09K 11/0883 257/98 |

FOREIGN PATENT DOCUMENTS

| | | | |
|---|---|---|---|
| EP | 2 022 835 | * | 2/2009 |
| JP | 2002-194347 A | | 7/2002 |
| JP | 2005-154611 A | | 6/2005 |
| JP | 2006-052337 A | | 2/2006 |
| JP | 2007-332324 A | | 12/2007 |
| JP | 2010-106127 A | | 5/2010 |
| WO | 2007/105631 A1 | | 9/2007 |
| WO | 2010/098141 A1 | | 9/2010 |

OTHER PUBLICATIONS

Chinese Office Action (With English Translation), Chinese Application No. 201380014503.8, dated Apr. 24, 2015 (13 pages).
International Search Report (With English Translation), International Application No. PCT/JP2013/057407, dated May 28, 2013 (5 pages).
Extended European Search Report (Application No. 13761020.0) dated Jul. 15, 2015.

* cited by examiner

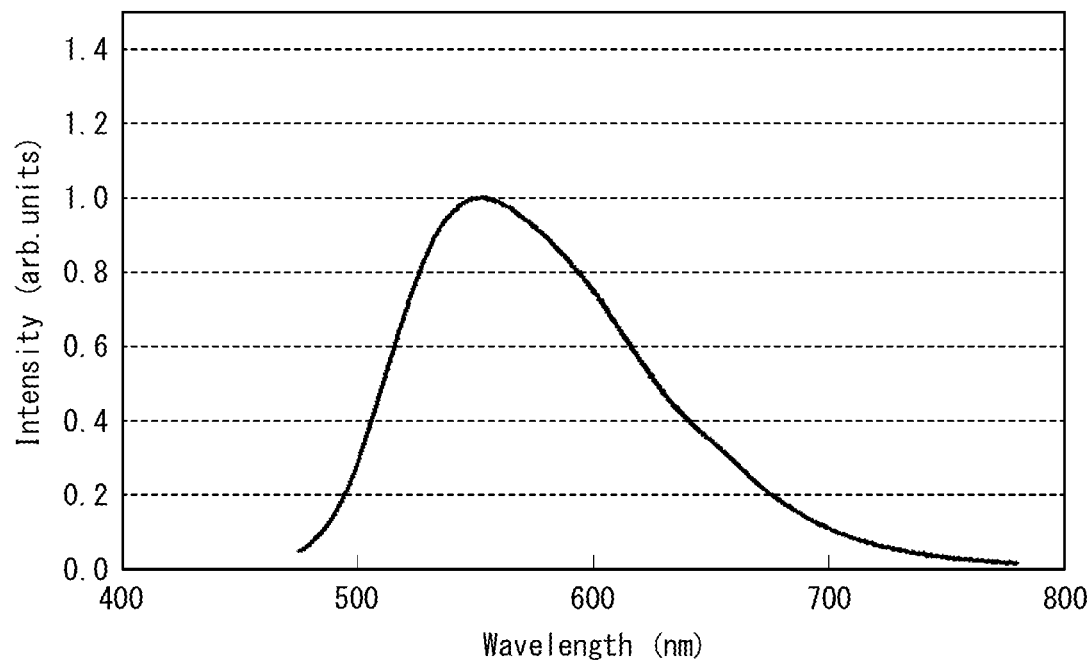

PHOSPHOR OF SIALON CRYSTAL, METHOD FOR PRODUCING PHOSPHOR AND LIGHT EMITTING DEVICE

BACKGROUND OF THE INVENTION

1. Field of the Invention

Embodiments of the present invention relate to a phosphor for emitting yellow light, a method for producing the phosphor and a light emitting device.

2. Description of Related Art

Phosphor powders are used, for example, for light emitting devices such as light emitting diodes (LEDs). Light emitting devices comprise, for example, a semiconductor light emitting element which is arranged on a substrate and emits light of a pre-determined color, and a light emitting portion containing a phosphor powder in a cured transparent resin, that is, an encapsulating resin. The phosphor powder contained in the light emitting portion emits visible light by being excited by ultraviolet light or blue light emitted from the semiconductor light emitting element.

Examples of the semiconductor light emitting element used in a light emitting device include GaN, InGaN, AlGaN and InGaAlP. Examples of the phosphor of the phosphor powder used include a blue phosphor, a green phosphor, a yellow phosphor and a red phosphor, which emit blue light, green light, yellow light and red light, respectively, by being excited by the light emitted from the semiconductor light emitting element.

In light emitting devices, the color of the radiation light (emitted light) can be adjusted by including various phosphor powders such as a yellow phosphor in an encapsulating resin. More specifically, using in combination a semiconductor light emitting element and a phosphor powder which absorbs light emitted from the semiconductor light emitting element and emits light of a predetermined wavelength range causes action between the light emitted from the semiconductor light emitting element and the light emitted from the phosphor powder, and the action enables emission of light of a visible light region or white light.

In the past, a phosphor containing strontium and having a cerium-activated sialon (Si—Al—O—N) structure (Sr sialon phosphor) has been known.

CITATION LIST

Patent Document

Patent Document 1: International Publication No. 2007/105631

SUMMARY OF THE INVENTION

Problems to be Solved by the Invention

However, a Sr sialon phosphor having higher luminous efficiency (efficacy) has been requested recently.

The present invention has been made under the above circumstances, and an object of the present invention is to provide a phosphor having a Sr sialon structure with high luminous efficiency, a method for producing the phosphor, and a light emitting device.

Means for Solving the Problems

A phosphor, a method for producing a phosphor and a light emitting device according to the embodiment of the present invention have been accomplished based on the technical finding that when a Sr sialon phosphor having a specific composition has a particle shape closer to a sphere, luminance (brightness) of a light emitting device using the Sr sialon phosphor is increased.

Wadell's sphericity ($\psi$) is known as an index for determining whether a particle shape is close to a sphere or not.

Wadell's sphericity ($\psi$) is defined by formula (A1) as a ratio of a surface area of a sphere having a same volume as that of an actual particle to a surface area of the actual particle.

[Expression 1]

$\psi$=(A surface area of a sphere having a same volume as that of an actual particle)/(A surface area of an actual particle) (A1)

Generally, in a particle having a certain volume, a surface area of a particle having a spherical shape is the smallest. Therefore, in common particles, Wadell's sphericity ($\psi$) is 1 or less, and it approaches 1 as the particle shape approaches a sphere.

A Sr sialon phosphor generally belongs to a low-symmetrical crystal system known as an orthorhombic system. Therefore, a particle shape of a Sr sialon phosphor has generally been a particle shape different from a sphere, for example, a shape such as tabular and columnar. The particle shape evaluated by Wadell's sphericity ($\psi$) has been 0.50 or less, which has been a shape quite different from a sphere.

Incidentally, in a light emitting device in which a semiconductor light emitting element and a phosphor are used in combination, light emitted from the semiconductor light emitting element is reflected by a surface of the phosphor or absorbed by the phosphor to cause the phosphor to emit light, and then the light emitted from the phosphor is transmitted outside while repeating multiple reflection, including reflection by surfaces of other phosphors.

However, when such a phenomenon of light reflection occurs, an energy loss of light will occur. Therefore, according to computer simulation or the like, it has been expected that a sphere having a small surface area will be suitable as a particle shape of a phosphor.

Under such circumstances, the present inventors have aimed at increasing sphericity of particle shapes of a Sr sialon phosphor. As a result, it has been found that when process conditions in producing a phosphor are set to specific conditions, sphericity of phosphor particles can be increased. Then, it has been found that a light emitting device using a phosphor having increased sphericity can significantly improve luminance level.

A phosphor according to the embodiment solves the above problem and comprises a cerium-activated sialon crystal having a basic composition represented by formula (1):

[Formula 1]

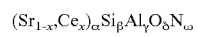    formula: (1)

(wherein, x is 0<x<1, α is 0<α≤3, and β, γ, δ and ω are numbers such that numerical values converted when α is 2 satisfy 5≤β≤9, 1≤γ≤5, 0≤α≤1.5, and 10≤ω≤20), wherein the phosphor includes particles having a sphericity of 0.65 or more and emits yellow light by being excited by ultraviolet light, violet light or blue light.

Further, a method for producing a phosphor according to the embodiment solves the above problem and comprises a method for producing the phosphor, comprising: a classification step of removing by classification a small particle portion which represents a phosphor powder having a particle size of 5 μm or less from the phosphor powder obtained by baking a mixture of phosphor raw materials that are raw materials for the phosphor; and an annealing step of subjecting the phosphor powder after classification to high temperature annealing treatment at 1950 to 2050° C.

Further, a light emitting device according to the embodiment solves the above problem and comprises: a substrate; a semiconductor light emitting element which is arranged on the substrate and emits ultraviolet light, violet light or blue light; and a light emitting portion which is formed so as to cover a light emitting surface of the semiconductor light emitting element and contains a phosphor which emits visible light by being excited by light emitted from the semiconductor light emitting element, wherein the phosphor comprises a phosphor according to any one of claims 1 to 5.

Advantages of the Invention

The phosphor having a Sr sialon structure and the light emitting device of the present invention have high luminous efficiency.

The method for producing a phosphor of the present invention can efficiently produce a phosphor having a Sr sialon structure and a light emitting device with high luminous efficiency.

BRIEF DESCRIPTION OF THE DRAWING

FIG. 1 illustrates an example of an emission spectrum of a light emitting device.

DETAILED DESCRIPTION OF THE INVENTION

A phosphor, a method for producing a phosphor and a light emitting device of the embodiment will be described hereunder. The phosphor of the embodiment is a yellow phosphor which emits yellow light by being excited by ultraviolet light, violet light or blue light.

[Yellow Phosphor]

The yellow phosphor of the present invention comprises a phosphor comprising a cerium-activated sialon crystal having a basic composition represented by formula (1):

[Formula 1]

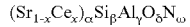
$(Sr_{1-x}Ce_x)_\alpha Si_\beta Al_\gamma O_\delta N_\omega$      formula: (1)

(wherein, x is 0<x<1, α is 0<α≤3, and δ, γ, δ and ω are numbers such that numerical values converted when α is 2 satisfy 5≤β≤9, 1≤γ≤5, 0≤δ≤1.5, and 10≤ω≤20). Further, the phosphor of the present invention emits yellow light by being excited by ultraviolet light, violet light or blue light. This yellow light emitting phosphor is also referred to as a "Sr sialon yellow phosphor" below. Furthermore, the phosphor of the present invention comprises particles having a sphericity of 0.65 or more.

Here, the relationship between the cerium-activated sialon crystal having a basic composition represented by formula (1) and the Sr sialon yellow phosphor will be described.

The cerium-activated sialon crystal having a basic composition represented by formula (1) is an orthorhombic single crystal.

On the other hand, the Sr sialon yellow phosphor is a crystal composed of one cerium-activated sialon crystal having a basic composition represented by formula (1), or an aggregate of crystals in which two or more of the cerium-activated sialon crystals are aggregated.

The Sr sialon yellow phosphor is generally in the form of single crystal powder.

The Sr sialon yellow phosphor powder has an average particle size of generally 1 μm or more and 100 μm or less, preferably 5 μm or more and 80 μm or less, more preferably 8 μm or more and 80 μm or less, and further preferably 8 μm or more and 40 μm or less. Here, the average particle size refers to a measured value by a Coulter counter method, which is the median $D_{50}$ in volume cumulative distribution. Particles of the powder generally have a tabular or columnar shape different from the shape of a sphere.

When the Sr sialon yellow phosphor is an aggregate of crystals in which two or more of the cerium-activated sialon crystals are aggregated, the respective cerium-activated sialon crystals can be separated by grinding.

In formula (1), x is a number that satisfies 0<x<1, preferably 0.025≤x≤0.5, and more preferably 0.25≤x≤0.5.

When x is 0, the baked body prepared in the baking step is not a phosphor. When x is 1, the Sr sialon yellow phosphor has low luminous efficiency.

Further, the smaller the x in the range of 0<x<1, the more likely the luminous efficiency of the Sr sialon yellow phosphor is to decrease. Furthermore, the larger the x in the range of 0<x<1, the more likely the concentration quenching is to occur due to an excess Ce concentration.

Therefore, in 0<x<1, x is a number that satisfies preferably 0.025≤x≤0.5, and more preferably 0.25≤x≤0.5.

In formula (1), the comprehensive index of Sr, (1−x)α, represents a number that satisfies 0<(1−x)α<3. Also, the comprehensive index of Ce, xα, represents a number that satisfies 0<xα<3. In other words, in formula (1), the comprehensive indices of Sr and Ce each represent a number of more than 0 and less than 3.

In formula (1), α represents the total amount of Sr and Ce. By defining the numerical values of β, γ, δ and ω when the total amount α is a constant value 2, the ratio of α, β, γ, δ and ψ in formula (1) is clearly determined.

In formula (1), β, γ, δ and ω represent numerical values converted when α is 2.

In formula (1), the index of Si, β, is a number such that the numerical value converted when α is 2 satisfies 5≤β≤9.

In formula (1), the index of Al, γ, is a number such that the numerical value converted when α is 2 satisfies 1≤γ≤5.

In formula (1), the index of O, δ, is a number such that the numerical value converted when α is 2 satisfies 0≤δ≤1.5.

In formula (1), the index of N, ω, is a number such that the numerical value converted when α is 2 satisfies 10≤ω≤20.

When the indices β, γ, δ and ω in formula (1) are out of the respective ranges, the composition of the phosphor prepared by baking is likely to be different from that of the orthorhombic Sr sialon yellow phosphor represented by formula (1).

The Sr sialon yellow phosphor of the present invention has a sphericity of 0.65 or more. Here, the sphericity means Wadell's sphericity (ψ).

It is preferable that the sphericity be 0.65 or more because luminance level of the Sr sialon yellow phosphor is high.

The Sr sialon yellow phosphor represented by formula (1) excited by receiving ultraviolet light, violet light or blue light emits yellow light or yellow to orange light having an emission peak wavelength in the range of 550 nm or more and 650 nm or less.

The Sr sialon yellow phosphor is produced, for example, by a method as described below.

[Method for Producing Yellow Phosphor]

The Sr sialon yellow phosphor represented by formula (1) can be produced, for example, by preparing a mixture of phosphor raw materials by dry blending raw materials such as strontium carbonate $SrCO_3$, aluminum nitride AlN, silicon nitride $Si_3N_4$, cerium oxide $CeO_2$ and an oxide of a non-Ce rare earth element and baking (sintering) the mixture of phosphor raw materials in nitrogen atmosphere.

The mixture of phosphor raw materials may further contain, as a flux agent, a fluoride of alkali metals or alkaline earth metals, such as potassium fluoride, or strontium chloride $SrCl_2$, which functions as a reaction accelerator.

A refractory crucible is charged with the mixture of phosphor raw materials. Examples of the refractory crucible used include a boron nitride crucible and a carbon crucible.

The mixture of phosphor raw materials in the refractory crucible is baked (sintered). An apparatus that can maintain composition and pressure of a baking atmosphere in which the refractory crucible is placed, and baking temperature and baking time at predetermined conditions is used as a baking apparatus (sintering furnace). Examples of such a baking apparatus used include an electric oven.

Inert gas is used as the baking atmosphere. Examples of the inert gas used include $N_2$ gas, Ar gas and a mixed gas of $N_2$ and $H_2$.

Generally, when a phosphor powder is prepared by baking a mixture of phosphor raw materials, a phosphor powder of a predetermined composition is obtained by elimination of an appropriate amount of oxygen O from the mixture of phosphor raw materials containing an excess amount of oxygen O based on the phosphor powder.

$N_2$ in the baking atmosphere has a function of eliminating an appropriate amount of oxygen O from the mixture of phosphor raw materials when a phosphor powder is prepared by baking the mixture of phosphor raw materials.

Also, Ar in the baking atmosphere has a function of preventing excess oxygen O from being supplied to the mixture of phosphor raw materials when a phosphor powder is prepared by baking the mixture of phosphor raw materials.

Also, $H_2$ in the baking atmosphere functions as a reducing agent and eliminates more oxygen O from the mixture of phosphor raw materials than $N_2$ when a phosphor powder is prepared by baking the mixture of phosphor raw materials.

Therefore, when inert gas contains $H_2$, the baking time can be reduced compared to the case where the inert gas does not contain $H_2$. However, when the content of $H_2$ in inert gas is too high, the resulting phosphor powder is likely to have a composition different from that of the Sr sialon yellow phosphor represented by formula (1), and therefore the phosphor powder is likely to have low emission intensity.

When the inert gas is $N_2$ gas or a mixed gas of $N_2$ and $H_2$, the inert gas has a molar ratio of $N_2$ to $H_2$, $N_2:H_2$, of generally 10:0 to 1:9, preferably 8:2 to 2:8, and more preferably 6:4 to 4:6.

When the inert gas has a molar ratio of $N_2$ to $H_2$ within the above range, that is, generally 10:0 to 1:9, a high quality single crystal phosphor powder with few defects in the crystal structure can be prepared by short-time baking.

The molar ratio of $N_2$ to $H_2$ in the inert gas can be set at the above ratio, that is, generally 10:0 to 1:9, by supplying $N_2$ and $H_2$ that are continuously supplied to the chamber of a baking apparatus so that the ratio of the flow rate of $N_2$ to that of $H_2$ is at the above ratio and by continuously discharging the mixed gas in the chamber.

It is preferable that the inert gas which is the baking atmosphere be allowed to flow so as to form a gas stream in the chamber of a baking apparatus because the raw materials can be homogeneously baked.

The inert gas which is the baking atmosphere has a pressure of generally 0.1 MPa (about 1 atm) to 1.0 MPa (about 10 atm), preferably 0.4 MPa to 0.8 MPa.

When the pressure of the baking atmosphere is less than 0.1 MPa, the phosphor powder obtained by baking is likely to have a composition different from that of the Sr sialon yellow phosphor represented by formula (1), as compared to the mixture of phosphor raw materials put in a crucible before baking. Therefore, the phosphor powder is likely to have low emission intensity.

When the pressure of the baking atmosphere is more than 1.0 MPa, the baking conditions are not very different from those in the case where the pressure is 1.0 MPa or less, which results in waste of energy and is not preferable.

The baking temperature is generally 1400° C. to 2000° C., preferably 1750° C. to 1950° C., more preferably 1800° C. to 1900° C.

When the baking temperature is in the range of 1400° C. to 2000° C., a high quality single crystal phosphor powder with few defects in the crystal structure can be obtained by short-time baking.

When the baking temperature is less than 1400° C., it is likely that the color of light emitted from the resulting phosphor powder when excited by ultraviolet light, violet light or blue light is not a desired one. More specifically, it is likely that when the Sr sialon yellow phosphor represented by formula (1) is desired to be produced, the color of light emitted when excited by ultraviolet light, violet light or blue light is not yellow.

When the baking temperature is more than 2000° C., the resulting phosphor powder is likely to have a composition different from that of the Sr sialon yellow phosphor represented by formula (1) due to an increased degree of elimination of N and O during baking. Therefore, the phosphor powder is likely to have low emission intensity.

The baking time is generally 0.5 hours to 20 hours, preferably 1 hour to 10 hours, more preferably 1 hour to 5 hours, further preferably 1.5 hours to 2.5 hours.

When the baking time is less than 0.5 hours or more than 20 hours, the resulting phosphor powder is likely to have a composition different from that of the Sr sialon yellow phosphor represented by formula (1). Therefore, the phosphor powder is likely to have low emission intensity.

When the baking temperature is high, the baking time is preferably short, ranging from 0.5 hours to 20 hours. When the baking temperature is low, the baking time is preferably long, ranging from 0.5 hours to 20 hours.

A baked body of a phosphor powder is produced in the refractory crucible after baking. Generally, the baked body is a weak agglomerate. When the baked body is lightly ground with a pestle or the like, a phosphor powder is obtained. The phosphor powder obtained by grinding is a powder of the Sr sialon yellow phosphor represented by formula (1).

The particles of the Sr sialon yellow phosphor prepared through processes as described above have a tabular or columnar shape different from the shape of a sphere. The present inventors have searched for a method for increasing sphericity of phosphor particle shapes and, as a result, have found that the particle shape is greatly influenced by removing small particles having a size of 5 μm or less contained in the phosphor and then subjecting the phosphor to annealing treatment at a high temperature of 1950 to 2050° C.

Specifically, the particle size distribution of the Sr sialon yellow phosphor obtained by a conventional production method comprises: a particle group having a peak at 7 to 18 μm; and a particle group having a peak at 1 to 7 μm. When such a phosphor was used to investigate the change of the particle shape by high temperature annealing treatment, the phosphor belonging to the large particle group has shown slight increase in sphericity of the particle shape to some extent.

However, it has been proven that the phosphor belonging to the small particle group enters into a gap formed in the large particle group and functions to react with the large particle group, undergo sintering and agglomerate the phosphor.

In order to use the phosphor agglomerated by annealing treatment as a powder, it is necessary to perform a grinding process using a ball mill or the like. However, since small particles that may have been produced by grinding are mixed in the phosphor that has passed through such a grinding process, the sphericity of the phosphor as the whole has not been improved.

Therefore, it has been found that, in the present invention, when high temperature annealing treatment is performed after previously removing by classification the small particle group contained in the Sr sialon yellow phosphor obtained by a conventional production method, the sphericity of the powder phosphor can be significantly improved because the agglomeration of the phosphor by the high temperature annealing treatment is suppressed. By the classification step and the high temperature annealing treatment, the Wadell's sphericity of the phosphor powder is improved from about 0.4 to 0.5 of the phosphor powder obtained by a conventional production method to 0.65 or more.

Here, Wadell's sphericity ($\psi$) has been determined by the following method. First, particle size distribution of a powder phosphor is measured by a Coulter counter method. In the resulting particle size distribution, Ni represents number frequency of a certain particle size Di. Here, the Coulter counter method is a method of specifying particle size from a voltage change depending on the volume of particles, and the particle size Di represents the diameter of a spherical particle having the same volume as that of an actual particle specified by the voltage change.

The number frequency Ni and particle size Di are used to calculate a specific surface area (S) of a powder phosphor. The specific surface area is a surface area of powder divided by weight thereof, and is defined as a surface area per unit weight.

A particle having a particle size Di has a weight of $(4\pi/3) \times (Di/2)^3 \times Ni \times \rho$ (here, $\rho$ is a density of powder). Weight of powder is represented by formula (A2) in which the weight is summed up for each particle size.

[Expression 2]

$$\Sigma\{(4\pi/3) \times (Di/2)^3 \times Ni \times \rho\} \quad (A2)$$

A particle having a particle size Di has a surface area of $4\pi \times (Di/2)^2 \times Ni$. However, since actual shape of particles is not a sphere, an actual specific surface area is a value obtained by summing up the surface area divided by Wadell's sphericity ($\psi$), $\{4\pi \times (Di/2)^2 \times Ni\}/\psi$, for each particle size.

Therefore, the specific surface area (S) of a powder phosphor is represented by formula (A3).

[Expression 3]

$$S = [\Sigma\{4\pi \times (Di/2)^2 \times Ni\}/\psi] / [\Sigma\{(4\pi/3) \times (Di/2)^3 \times Ni \times \rho\}] \quad (A3)$$
$$= (6/\rho/\psi) \times \{\Sigma(Di^2 \times Ni)\} / \{\Sigma(Di^3 \times Ni)\}$$

Actually, Wadell's sphericity ($\psi$) may be a little different for each particle size, which can be interpreted as an average value of deviations from a sphere, as a whole powder.

On the other hand, a flowing-gas technique (such as a Blaine method and a Fisher method or the like) is known as a method for measuring a particle size of powder. In this method, a metal tube with both ends opened is filled with powder, and air is passed through the powder layer, that is, caused to flow therethrough to specify the particle size from an ease of passing air. This particle size is called a specific surface area diameter (d). The specific surface area diameter (d) and the specific surface area (S) have a relationship of formula (A4).

[Expression 4]

$$S = 6/\rho/d \quad (A4)$$

Therefore, Wadell's sphericity ($\psi$) can be determined by formula (A5) by comparing the specific surface area calculated from the particle size distribution to the specific surface area calculated from the particle size by the flowing-gas technique.

[Expression 5]

$$\psi = d \times \{\Sigma(Di^2 \times Ni)\} / \{\Sigma(Di^3 \times Ni)\} \quad (A5)$$

A particle size in a particle size distribution is generally expressed as a particle size range. However, in the present invention, a median value in a particle size range given by a particle size Di is used, and every particle size range has been set at 0.2 μm in order to improve precision. The particle size distribution can be approximated by two straight lines when the distribution is plotted on logarithmico-normal probability paper. Therefore, number frequency data for every 0.2 μm can be easily obtained from the two normal probability distributions.

In a phosphor powder obtained by baking a mixture of phosphor raw materials as described above, particle size distribution comprises, for example, a particle group having a peak in a range of more than 7 μm to 18 μm or less and a particle group having a peak in a range of more than 1 μm to 7 μm or less. In the present invention, a powder belonging to the small particle group in particle size distribution is removed by taking the classification step of removing by classification a small particle portion from the phosphor powder obtained by baking a mixture of phosphor raw materials.

(Classification Step)

The classification step is a step of removing by classification a small particle portion which is a phosphor powder having a particle size of 5 μm or less from the phosphor powder obtained by baking a mixture of phosphor raw materials that are raw material for a phosphor.

The small particle portion removed by classification in the classification step is generally a powder of 5 μm or less, preferably a powder of 7 μm or less.

Examples of classification methods that can be used include a classification method of using a mesh and a classification method of dispersing a phosphor in water, allowing the dispersion to stand, and removing small particles by the difference in settlement due to the particle size. The amount of small particles removed by such classification is 15% by mass or less based on the amount of a phosphor before classification.

A phosphor powder having a particle size distribution from which a portion with a small particle size has been removed is obtained by performing this classification step.

In the present invention, the phosphor powder obtained by performing the classification step is then subjected to an annealing step.

(Annealing Step)

The annealing step is a step of subjecting the phosphor powder after completion of the classification to high temperature annealing treatment at 1950 to 2050° C.

If the temperature of annealing treatment is less than 1950° C., the increase in sphericity by annealing is small.

If the temperature of annealing treatment exceeds 2050° C., the luminance of the phosphor is likely to decrease.

The time of annealing treatment is generally set to 3 hours or more, preferably 10 hours or less.

If the time of annealing treatment is less than 3 hours, the increase in sphericity of the phosphor powder by annealing treatment may not be sufficient.

If the time of annealing treatment exceeds 10 hours, the particle size of the phosphor powder is likely to be increased by the sintering between particles.

By subjecting the phosphor powder obtained by performing the classification step to annealing step, the Wadell's sphericity of the phosphor powder will be 0.65 or more.

Table 1 shows an example of the relationship between the change in sphericity of a phosphor powder and the luminance of the light emitting device of the present invention. As a phosphor, a phosphor having a composition of $Sr_{1.6}Ce_{0.4}Si_7Al_3ON_{13}$ was used.

TABLE 1

| | Manufacturing Conditions | | | Light Emitting Device Light Emission Luminance (%) |
|---|---|---|---|---|
| | Classification Step (Removing 14 mass % of smaller particle side group from total phosphor particles) | High Temperature Anealing Treatment (2000° C., 5 Hr) | Phosphor Powder Sphericity ($\psi$) | |
| Conventional Method | None | None | 0.45 | 100 |
| Classification and High Temperature Annealing Treatment for Phosphor | Conducted | Conducted | 0.70 | 115 |

As is clear from the results shown in Table 1, there is a correlation between sphericity and light emission luminance. Thus, it is found that the luminance of a light emitting device can be effectively improved by using the Sr sialon yellow phosphor according to the present invention.

[Light Emitting Device]

The light emitting device uses the Sr sialon yellow phosphor represented by formula (1).

More specifically, the light emitting device comprises: a substrate; a semiconductor light emitting element which is arranged on the substrate and emits ultraviolet light, violet light or blue light; and a light emitting portion which is formed so as to cover a light emitting surface of the semiconductor light emitting element and contains a phosphor which emits visible light by being excited by light emitted from the semiconductor light emitting element, wherein the phosphor comprises the Sr sialon yellow phosphor represented by formula (1). Thereby, the light emitting device emits yellow light.

Alternatively, when the light emitting device is designed so that the light emitting portion contains a blue phosphor and green and red phosphors such as Sr sialon green and red phosphors having a Sr sialon structure in addition to the Sr sialon yellow phosphor, the device can become a white light emitting device which emits white light from the emitting surface thereof as a result of color mixture of light such as red light, blue light and green light emitted from the phosphors of respective colors.

Note that the light emitting device may contain, as a phosphor, the Sr sialon yellow phosphor represented by formula (1), and the Sr sialon green phosphor and Sr sialon red phosphor. When the light emitting device contains the Sr sialon yellow, green, and red phosphors as a phosphor, the resulting light emitting device has good temperature characteristics.

(Substrate)

Examples of a substrate used include ceramics such as alumina and aluminum nitride (AlN) and glass epoxy resin. A substrate made of an alumina plate or an aluminum nitride plate is preferred because it has high thermal conductivity and can suppress a temperature rise in LED light sources.

(Semiconductor Light Emitting Element)

A semiconductor light emitting element is arranged on the substrate.

As the semiconductor light emitting element, a semiconductor light emitting element which emits ultraviolet light, violet light or blue light is used. Here, the ultraviolet light, violet light or blue light means light having a peak wavelength in the wavelength range of ultraviolet, violet or blue light, respectively. It is preferable that the ultraviolet light, violet light or blue light have a peak wavelength in the range of 370 nm or more and 470 nm or less.

Examples of the semiconductor light emitting element that emits ultraviolet light, violet light or blue light which are used include ultraviolet light emitting diodes, violet light emitting diodes, blue light emitting diodes, ultraviolet laser diodes, violet laser diodes and blue laser diodes. Note that when a laser diode is used as the semiconductor light emitting element, the peak wavelength described above means a peak oscillation wavelength.

(Light Emitting Portion)

The light emitting portion contains, in a cured transparent resin, a phosphor which emits visible light by being excited by ultraviolet light, violet light or blue light emitted from the semiconductor light emitting element. The light emitting portion is formed so as to cover a light emitting surface of the semiconductor light emitting element.

The phosphor used in the light emitting portion comprises at least the Sr sialon yellow phosphor described above. Alternatively, the phosphor may comprise the Sr sialon green and red phosphors.

Also, the phosphor used in the light emitting portion may comprise the Sr sialon yellow phosphor and a phosphor different from the Sr sialon yellow phosphor. Examples of the phosphor different from the Sr sialon yellow phosphor which may be used include a red phosphor, a blue phosphor, a green phosphor, a yellow phosphor, a violet phosphor and an orange phosphor. Phosphors in the form of powder are generally used.

In the light emitting portion, the phosphor is present in a cured transparent resin. Generally the phosphor is dispersed in the cured transparent resin.

The cured transparent resin used for the light emitting portion is a resin prepared by curing a transparent resin, that is, a resin having high transparency. Examples of transparent resins used include silicone resins and epoxy resins. Silicone resins are preferred because they have higher UV resistance than epoxy resins. Among the silicone resins, dimethyl silicone resin is more preferred because of its high UV resistance.

It is preferred that the light emitting portion comprise a cured transparent resin in a proportion of 20 to 1000 parts by mass based on 100 parts by mass of the phosphor. When the proportion of the cured transparent resin to the phosphor is in this range, the light emitting portion has high emission intensity.

The light emitting portion has a film thickness of generally 80 μm or more and 800 μm or less, and preferably 150 μm or more and 600 μm or less. When the light emitting portion has a film thickness of 80 μm or more and 800 μm or less, practical brightness can be secured with a small amount of leakage of ultraviolet light, violet light or blue light emitted from the semiconductor light emitting element. When the light emitting portion has a film thickness of 150 μm or more and 600 μm or less, a brighter light can be emitted from the light emitting portion.

The light emitting portion is obtained, for example, by first mixing a transparent resin and a phosphor to prepare a phosphor slurry in which the phosphor is dispersed in the transparent resin, and then applying the phosphor slurry to a semiconductor light emitting element or to the inner surface of a globe, and curing.

When the phosphor slurry is applied to the semiconductor light emitting element, the light emitting portion covers the semiconductor light emitting element with being in contact therewith. When the phosphor slurry is applied to the inner surface of a globe, the light emitting portion is remote (apart) from the semiconductor light emitting element and formed on the inner surface of the globe. The light emitting device in which the light emitting portion is formed on the inner surface of the globe is called a remote phosphor type LED light emitting device.

The phosphor slurry may be cured by heating, for example, at 100° C. to 160° C.

FIG. 1 illustrates an example of an emission spectrum of a light emitting device.

More specifically, FIG. 1 illustrates an emission spectrum of a yellow light emitting device at 25° C., in which a violet LED which emits violet light having a peak wavelength of 400 nm is used as a semiconductor light emitting element and only a Sr sialon yellow phosphor having a basic composition represented by $Sr_{1.6}Ce_{0.4}Si_7Al_3ON_{13}$ is used as a phosphor.

Note that the violet LED has a forward voltage drop Vf of 3.190 V and a forward current If of 20 mA.

As shown in FIG. 1, the yellow light emitting device using the Sr sialon yellow phosphor represented by formula (1) as a phosphor is confirmed to have high emission intensity even when a short-wavelength excitation light such as violet light is used.

EXAMPLES

Examples will be shown below, but the present invention should not be construed as being limited thereto.

Example 1

Production of Yellow Phosphor

First, 312 g of $SrCO_3$, 162 g of AlN, 432 g of $Si_3N_4$, and 91 g of $CeO_2$ were weighed and an appropriate amount of a flux agent was added thereto, and the mixture was dry-blended to prepare a mixture of phosphor raw materials. Thereafter, a boron nitride crucible was charged with the mixture of phosphor raw materials.

The boron nitride crucible charged with the mixture of phosphor raw materials was baked in an electric furnace in a nitrogen atmosphere of 0.7 MPa (about 7 atm) at 1850°C. for 2 hours. As a result, an agglomerate of the baked powder was obtained in the crucible.

Next, the agglomerate was ground, and then pure water was added to the baked powder in an amount of 10 times the mass of the baked powder. The resulting mixture was stirred for 10 minutes and filtered to obtain a baked powder. The procedure of washing the baked powder was repeated another 4 times to carry out washing for 5 times in total.

<Classification Step>

Next, the classification was performed by adding pure water to the washed baked powder in an amount of 10 times the mass of the baked powder in the same manner as in washing, stirring the mixture for 10 minutes, stopping the stirring, allowing the resulting mixture to stand for a predetermined period of time, and then discharging a supernatant with a phosphor having small particles. The operation of classification was repeated 3 times. The baked powder after classification was filtered and dried, and then sieved through a nylon mesh with an aperture of 45 μm.

<Annealing Step>

Next, a boron nitride crucible was charged with the phosphor powder obtained by sieving, and the phosphor powder was subjected to a high-temperature annealing treatment at a temperature of 2000°C. for 5 hours in a nitrogen atmosphere of 0.7 MPa (about 7 atm) in an electric furnace. After completion of the annealing treatment, the resulting phosphor powder was subjected to milling treatment, washed, dried, and sieved to obtain the baked powder of Example 1 according to the present invention.

The baked powder was analyzed and found to be a single crystal Sr sialon yellow phosphor having the composition shown in Table 2.

TABLE 2

| Sample No. | Basic Composition of Baked Powder | Classification Process Removing ratio of small particles (mass %) | Annealing Process Temperature (° C.) | Annealing Process Time (Hr) | Sphericity ($\Psi$) | Luminous Efficacy (%) |
|---|---|---|---|---|---|---|
| Example 1 | $Sr_{1.6}Ce_{0.4}Si_7Al_3ON_{13}$ | 14 | 2000 | 5 | 0.7 | 115 |
| Comparative Example 1 | $Sr_{1.6}Ce_{0.4}Si_7Al_3ON_{13}$ | — | — | — | 0.45 | 100 |
| Example 2 | $Sr_{1.7}Ce_{0.3}Si_8Al_3O_{0.1}N_{12}$ | 12 | 2050 | 7 | 0.68 | 112 |
| Comparative Example 2 | $Sr_{1.7}Ce_{0.3}Si_8Al_3O_{0.1}N_{12}$ | — | — | — | 0.47 | 100 |
| Example 3 | $Sr_{1.6}Ce_{0.4}Si_{7.2}Al_2O_{0.5}N_{13}$ | 15 | 1970 | 3 | 0.69 | 110 |
| Comparative Example 3 | $Sr_{1.6}Ce_{0.4}Si_{7.2}Al_2O_{0.5}N_{13}$ | — | — | — | 0.44 | 100 |
| Example 4 | $Sr_{2.6}Ce_{0.4}Si_9Al_3O_{0.7}N_{15}$ | 14 | 2030 | 4 | 0.66 | 113 |
| Comparative Example 4 | $Sr_{2.6}Ce_{0.4}Si_9Al_3O_{0.7}N_{15}$ | — | — | — | 0.48 | 100 |
| Example 5 | $Sr_{1.6}Ce_{0.4}Si_8Al_4ON_{14}$ | 13 | 1960 | 6 | 0.71 | 114 |
| Comparative Example 5 | $Sr_{1.6}Ce_{0.4}Si_8Al_4ON_{14}$ | — | — | — | 0.5 | 100 |
| Example 6 | $Sr_{2.5}Ce_{0.3}Si_8Al_4O_{0.5}N_{15}$ | 10 | 2010 | 6 | 0.7 | 115 |
| Comparative Example 6 | $Sr_{2.5}Ce_{0.3}Si_8Al_4O_{0.5}N_{15}$ | — | — | — | 0.43 | 100 |
| Example 7 | $Sr_{1.7}Ce_{0.3}Si_7Al_{2.5}O_{0.1}N_{12}$ | 15 | 2000 | 4 | 0.69 | 114 |
| Comparative Example 7 | $Sr_{1.7}Ce_{0.3}Si_7Al_{2.5}O_{0.1}N_{12}$ | — | — | — | 0.42 | 100 |
| Example 8 | $Sr_{1.6}Ce_{0.4}Si_6Al_4ON_{14}$ | 14 | 2040 | 8 | 0.66 | 112 |
| Comparative Example 8 | $Sr_{1.6}Ce_{0.4}Si_6Al_4ON_{14}$ | — | — | — | 0.45 | 100 |
| Example 9 | $Sr_{1.7}Ce_{0.3}Si_8Al_{2.7}O_{0.6}N_{13}$ | 13 | 1980 | 6 | 0.68 | 116 |
| Comparative Example 9 | $Sr_{1.7}Ce_{0.3}Si_8Al_{2.7}O_{0.6}N_{13}$ | — | — | — | 0.43 | 100 |
| Example 10 | $Sr_{1.6}Ce_{0.4}Si_7Al_{2.1}O_{0.2}N_{14}$ | 12 | 2000 | 5 | 0.7 | 116 |
| Comparative Example 10 | $Sr_{1.6}Ce_{0.4}Si_7Al_{2.1}O_{0.2}N_{14}$ | — | — | — | 0.48 | 100 |

(Production of Light Emitting Device)

A light emitting device was produced by using the resulting Sr sialon yellow phosphor.

(Evaluation of Yellow Phosphor and Light Emitting Device)

Sphericity was measured for the resulting Sr sialon yellow phosphor, and the luminous efficacy (light emission luminance) of the light emitting device using the Sr sialon yellow phosphor was measured. The luminous efficacy, measured at room temperature (25° C.), is shown as a relative value (%) in which the luminous efficacy (lm/W) at room temperature of a light emitting device in Comparative Example 1 to be described below is taken as 100.

Note that the phosphor in Comparative Example 1 is produced in the same manner as in Example 1 except that the classification step and the annealing step are not performed.

The measurement results of sphericity and luminous efficacy are shown in Table 2.

Comparative Example 1

A phosphor was produced in the same manner as in Example 1 except that the classification step and the annealing step were not performed.

Sphericity was measured for the resulting yellow phosphor, and the luminous efficacy of the light emitting device using this phosphor was measured, in the same manner as in Example 1. The measurement results of sphericity and luminous efficacy are shown in Table 2.

Examples 2 to 10 and Comparative Examples 2 to 10

Production of Yellow Phosphor

Yellow phosphors were produced in the same manner as in Example 1 except that the conditions of the classification step and the annealing step were changed as shown in Table 2 (Examples 2 to 10).

Phosphors were produced in the same manner as in respective Examples 2 to 10 except that the classification step and the annealing step were not performed (Comparative Examples 2 to 10).

Sphericity was measured for the resulting yellow phosphors (Examples 2 to 10 and Comparative Examples 2 to 10), and the luminous efficacy of the light emitting device using these phosphors was measured, in the same manner as in Example 1. The measurement results of sphericity and luminous efficacy are shown in Table 2.

Note that the luminous efficacy of light emitting devices in Examples 2 to 10 is shown as a relative value (%) in which the luminous efficacy (lm/W) of light emitting devices in Comparative Examples produced in the same manner as in Examples except for not performing the classification step and the annealing step is taken as 100.

More specifically, the luminous efficacy of light emitting devices in Examples 2 to 10 is shown as a relative value (%) in which the luminous efficacy (lm/W) of light emitting devices in Comparative Examples 2 to 10, respectively, is taken as 100.

Table 2 shows that a phosphor having increased sphericity by the process of the present invention and the light emitting devices each using the phosphor have better luminous efficacy than conventional phosphors and light emitting devices using conventional phosphors.

Note that although several embodiments of the present invention have been described, these embodiments are presented as examples only and are not intended to limit the scope of the present invention. These new embodiments can be performed in other various modes, and various omissions, substitutions and changes can be made without departing from the spirit of the invention. These embodiments and modifications thereof are included in the scope and spirit of the invention, and included in the invention described in the claims and its equivalent scope.

The invention claimed:

1. A phosphor comprising a cerium-activated Sialon crystal having at least one basic composition selected from the group consisting of:

$(Sr_{1-x},Ce_x)_{2.0}Si_7Al_3ON_{13}$;
$(Sr_{1-x},Ce_x)_{2.0}Si_8Al_3O_{0.1}N_{12}$;
$(Sr_{1-x},Ce_x)_{2.0}Si_{7.2}Al_2O_{0.5}N_{13}$;
$(Sr_{1-x},Ce_x)_{3.0}Si_9Al_3O_{0.7}N_{15}$;
$(Sr_{1-x},Ce_x)_{2.0}Si_8Al_4ON_{14}$;
$(Sr_{1-x},Ce_x)_{2.8}Si_8Al_4O_{0.5}N_{15}$;
$(Sr_{1-x},Ce_x)_{2.0}Si_7Al_{2.5}O_{0.1}N_{12}$;
$(Sr_{1-x},Ce_x)_{2.0}Si_6Al_4ON_{14}$;
$(Sr_{1-x},Ce_x)_{2.0}Si_8Al_{2.7}O_{0.6}N_{13}$; and
$(Sr_{1-x},Ce_x)_{2.0}Si_7Al_{2.1}O_{0.2}N_{14}$, wherein x is 0<x<1 wherein the phosphor includes particles having a Wadell's sphericity of 0.65 or more and emits yellow light by being excited by ultraviolet light, violet light or blue light, and wherein the Wadell's sphericity (ψ) is defined by the formula:

ψ=(A surface area of a sphere having a same volume as that of an actual particle)/(A surface area of an actual particle).

2. The phosphor according to claim 1, wherein the phosphor belongs to an orthorhombic system.

3. The phosphor according to claim 1, wherein the ultraviolet light, violet light or blue light has a peak wavelength in a range of 370 nm or more and 470 nm or less.

4. The phosphor according to claim 1, wherein the phosphor has an average particle size of 5 μm or more and 80 μm or less.

5. The phosphor according to claim 1, wherein the phosphor has an emission peak wavelength of 550 nm or more and 650 nm or less.

6. A method for producing a phosphor according to claim 1, comprising:

a classification step of removing by classification a small particle portion which represents a phosphor powder having a particle size of 5 μm or less from the phosphor powder obtained by baking a mixture of phosphor raw materials that are raw materials for the phosphor; and an annealing step of subjecting the phosphor powder after classification to high temperature annealing treatment in a nitrogen gas atmosphere at 1950 to 2050° C. for 3 to 10 hours.

7. A light emitting device comprising:

a substrate;

a semiconductor light emitting element which is arranged on the substrate and emits ultraviolet light, violet light or blue light; and a light emitting portion which is formed so as to cover a light emitting surface of the semiconductor light emitting element and contains a phosphor which emits visible light by being excited by light emitted from the semiconductor light emitting element, wherein the phosphor comprises a phosphor according to claim 1.

8. The light emitting device according to claim 7, wherein the semiconductor light emitting element is a light emitting diode or a laser diode which emits light having a peak wavelength in a range of 370 nm or more and 470 nm or less.

* * * * *